(12) United States Patent
Mirzaei et al.

(10) Patent No.: US 7,907,927 B2
(45) Date of Patent: Mar. 15, 2011

(54) MERGED HIGH PASS FILTERING AND DOWN-CONVERTING MIXER CIRCUIT

(75) Inventors: Ahmad Mirzaei, Los Angeles, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 741 days.

(21) Appl. No.: 11/804,535

(22) Filed: May 17, 2007

(65) Prior Publication Data

US 2008/0287087 A1  Nov. 20, 2008

(51) Int. Cl.
*H04B 1/16* (2006.01)
(52) U.S. Cl. ........................................... 455/323
(58) Field of Classification Search .................. 455/313, 455/318, 323, 324, 326, 333, 334
See application file for complete search history.

(56) References Cited

U.S. PATENT DOCUMENTS

| | | | | |
|---|---|---|---|---|
| 5,678,224 A * | 10/1997 | Murtojarvi | ................... | 455/326 |
| 6,157,822 A * | 12/2000 | Bastani et al. | ................ | 455/323 |
| 6,404,263 B1 * | 6/2002 | Wang | ............................ | 327/359 |
| 6,472,925 B1 * | 10/2002 | Komurasaki et al. | ......... | 327/361 |
| 7,088,169 B2 * | 8/2006 | Erba et al. | ..................... | 327/359 |
| 7,088,982 B1 * | 8/2006 | Chien | ........................... | 455/326 |
| 7,289,783 B2 * | 10/2007 | Rostami et al. | .............. | 455/323 |
| 7,509,111 B2 * | 3/2009 | Langenberg et al. | ......... | 455/326 |

* cited by examiner

*Primary Examiner* — Blane J Jackson
(74) *Attorney, Agent, or Firm* — Farjami & Farjami LLP

(57) ABSTRACT

According to one exemplary embodiment, a mixer circuit comprises first and second switching branches driven by a local oscillator and an input radio frequency (RF) signal. The mixer circuit further comprises at least one capacitor coupled between the first and second switching branches for high-pass filtering of a down-converted output signal of the mixer circuit. In one embodiment, each switching branch comprises a respective mixer transistor, for example, a field effect transistor (FET). In one embodiment, the mixer circuit includes an inductor to reduce or eliminate the effects of parasitic capacitors at a resonance frequency selected to approximately match a desired RF signal frequency. In one embodiment, an inductor at resonance with parasitic capacitors produces a band pass filter for an input RF signal.

16 Claims, 5 Drawing Sheets

MERGED HIGH PASS FILTERING AND DOWN-CONVERTING MIXER CIRCUIT

BACKGROUND OF THE INVENTION

1. Field of the Invention

The present invention is generally in the field of electronic circuits and systems. More specifically, the present invention is in the field of communications circuits and systems.

2. Background Art

Mixer circuits are typically used in receiving systems to, for example, down-convert an input radio frequency (RF) signal prior to filtering and amplification. Receiving systems can utilize a mixer circuit in conjunction with a local oscillator to down-convert an input RF signal, which may include both desired and undesired signal components. In conventional low-IF receiving systems, the output of the mixer circuit is typically fed into a separate high pass filter, to achieve blocking cancellation of the undesired signal component at around DC level. Frequently, the desired signal extracted in this way requires amplification, which may then be provided by a low noise amplifier (LNA).

Conventional implementations of mixer circuits utilizing separate circuits to mix and filter a desired signal component introduce several drawbacks. One drawback is that reliance on separate circuits to achieve down-conversion and filtering results in a bulky solution. Another drawback is that where the undesired component of the down-converted input RF signal has substantially greater amplitude than the desired signal component, as may often be the case, the linearity requirement for the high pass filter can be stringent, making that system component particularly costly. Moreover, use of a separate high pass filter may introduce an additional noise component to the filtered output, as a result of the high pass filter's intrinsic filter noise. Subsequent amplification of the desired signal component includes amplification of the filter noise as well, thereby degrading signal quality.

Thus, there is a need in the art for a mixer circuit having a compact, cost effective implementation, and capable of providing blocking cancellation of a strong undesired signal component at around DC level after down-conversion while adding substantially no filter noise.

SUMMARY OF THE INVENTION

A merged high pass filtering and down-converting mixer circuit, substantially as shown in and/or described in connection with at least one of the figures, and as set forth more completely in the claims.

DETAILED DESCRIPTION OF THE INVENTION

The present invention is directed to a merged high pass filtering and down-converting mixer circuit. The following description contains specific information pertaining to the implementation of the present invention. Although the invention is described with respect to specific embodiments, the principles of the invention, as defined by the claims appended herein, can be applied beyond the specified embodiments of the invention described. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1A:
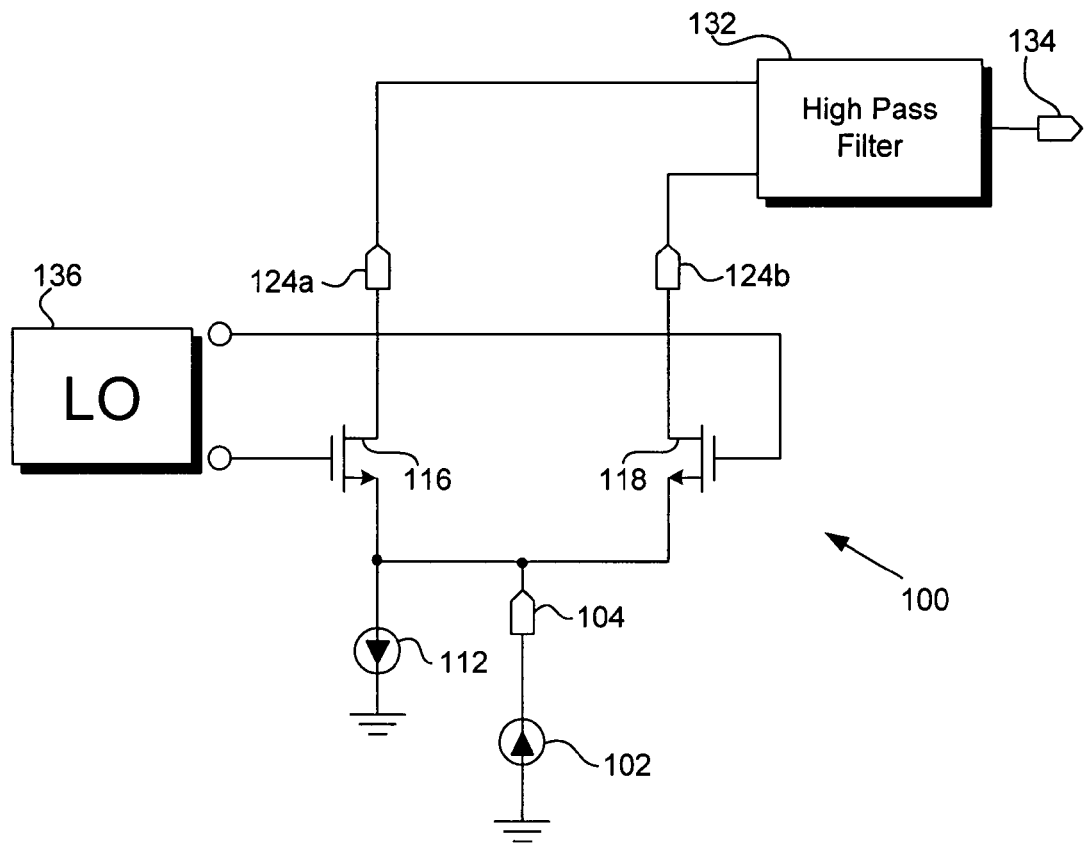
FIG. 1A shows a conventional implementation for mixing and high pass filtering an input RF signal.

FIG. 1A shows a conventional implementation for mixing and high pass filtering an input radio frequency (RF) signal. It should be noted, moreover, that a conventional implementation for mixing and filtering an RF signal may include additional elements not present in FIG. 1A. Those additional elements are not shown in the present figure for purposes of brevity and simplicity of presentation. FIG. 1A shows conventional mixer circuit 100 in conjunction with local oscillator 136 and high pass filter 132. As shown in FIG. 1A, input RF current source 102 is coupled to input 104 of mixer circuit 100. Bias current source 112 provides bias currents to mixer circuit 100. Local oscillator 136 provides input to mixer circuit transistors 116 and 118, which in the present embodiment are field effect transistors (FETs). Mixer circuit 100 provides outputs 124a and 124b to high pass filter 132, which in turn provides output 134.

Figure 1B:
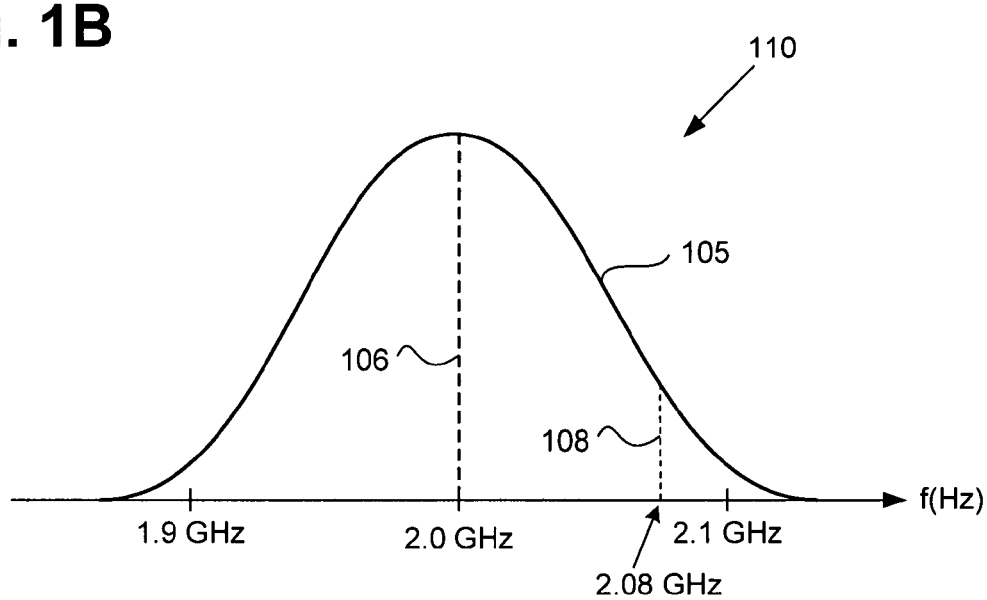
FIG. 1B shows a frequency distribution of an exemplary input RF signal.

FIG. 1B shows a frequency distribution of an exemplary input RF signal corresponding to a signal provided by input RF source 102 in FIG. 1A. Frequency distribution 110 (covering a frequency range between approximately 1.9 GHz and 2.1 GHz) in FIG. 1B shows input RF signal 105 comprising exemplary undesired signal component 106 and exemplary desired signal component 108. As shown in FIG. 1B, exemplary undesired signal component 106 is centered at 2.0 GHz and is substantially larger, i.e. has substantially greater amplitude, than exemplary desired signal component 108 located at 2.08 GHz.

Continuing with FIGS. 1A and 1B, in the conventional implementation shown by mixer circuit 100, local oscillator 136 delivers a local oscillator signal with frequency $f_{LO}$ (approximately 2.0 GHz) to mixer transistors 116 and 118, resulting in down-conversion of input RF signal 105 having frequency $f_{RF}$. As a result, a down-converted signal having frequency $f_D = f_{RF} - f_{LO}$ is provided at mixer circuit outputs 124a and 124b, as is known in the art.

For the purposes of the present example, input RF signal 105 comprises strong undesired signal component 106 at 2.0 GHz and substantially weaker desired signal component 108 at 2.08 GHz, as mentioned above, while local oscillator 136 is tuned to provide a signal at 2.0 GHz. Thus, as a result of down-conversion provided by conventional mixer circuit 100, mixer circuit outputs 124a and 124b can be characterized as comprising a strong undesired signal component at 2.0 GHz-2.0 GHz, or zero Hz (i.e., at DC level), and a substantially weaker desired signal component at 2.08 GHz-2.0 GHz, i.e. a desired signal component at 80 MHz.

Figure 1C:
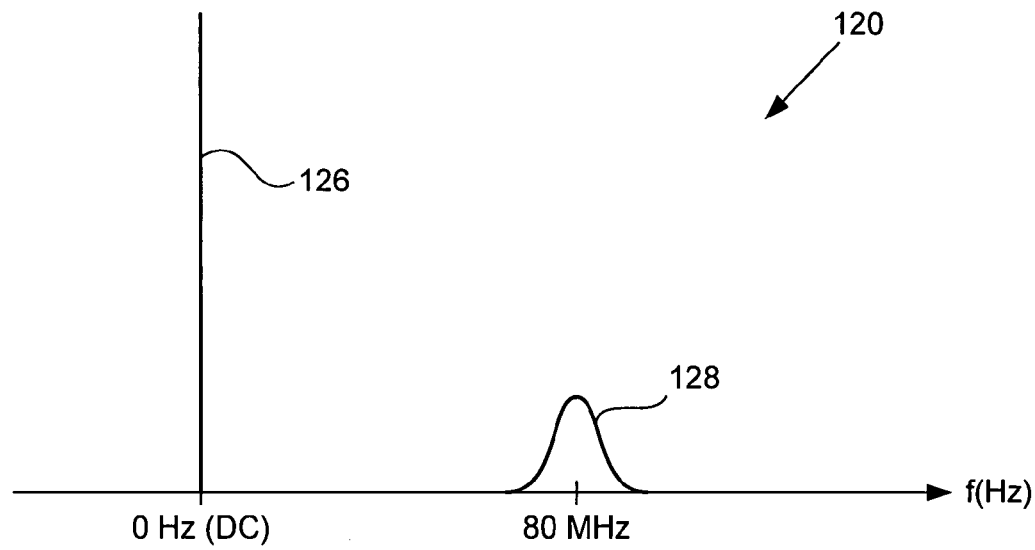
FIG. 1C shows the effect of down-conversion on the frequency distribution of the exemplary input RF signal of FIG. 1B.

FIG. 1C shows the effect of down-conversion on the frequency distribution of the exemplary input RF signal of FIG. 1B. As described above, frequency distribution 120 shows strong undesired signal 126 at DC level and desired signal 128 centered at 80 MHz. In the conventional implementation of FIG. 1A, the signal appearing at mixer circuit outputs 124a and 124b comprising undesired signal component 126 and desired signal component 128 of FIG. 1C, is passed through high pass filter 132. High pass filtering of the down-converted signal provided by conventional mixer circuit 100 of FIG. 1A is necessary to substantially eliminate undesired signal 126 to, for example, avoid saturation of the next amplifier stage (not shown) due to the presence of strong undesired signal component 126 at mixer circuit outputs 124a and 124b.

Figure 1D:
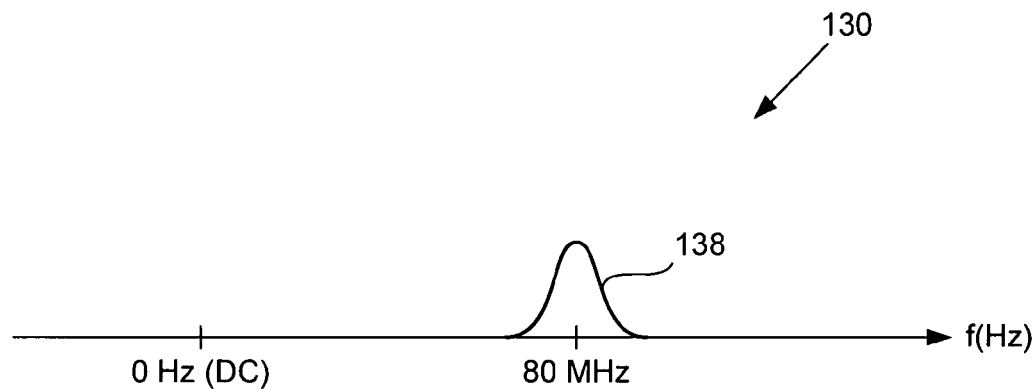
FIG. 1D shows the effect of passing the frequency distribution of FIG. 1C through an exemplary high pass filter.

FIG. 1D shows the effect of passing the down-converted signal produced by conventional mixer circuit 100 and shown in FIG. 1C through high pass filter 132. As can be seen by comparison of FIG. 1C and frequency distribution 130 in FIG. 1D, high pass filtering provides blocking cancellation of strong undesired signal component 126, down-converted to DC, while passing desired signal component 128 in FIG. 1C. The resulting signal 138, appearing at output 134 in FIG. 1A, comprises the desired signal component at 80 MHz and conventional filter noise added by passage through high pass filter 132.

The conventional approach to mixing and high pass filtering an input RF signal utilizing a mixer circuit and a separate high pass filter as shown in FIG. 1A entails several disadvantages. One disadvantage is that reliance on separate circuits to achieve down-conversion and filtering results in a bulky implementation. Another disadvantage is that where the undesired signal component of the down-converted input RF signal has substantially greater amplitude than the desired signal component, as was the case for the input RF signal 105 in FIG. 1B, the linearity requirement for high pass filter 132 can be stringent, making that system component particularly costly. In addition, use of separate high pass filter 132 can introduce an additional noise component to the filtered output, due to the high pass filter's intrinsic filter noise. Subsequent—amplification of the desired signal component includes amplification of the filter noise resulting in reduced signal quality.

Figure 2A:
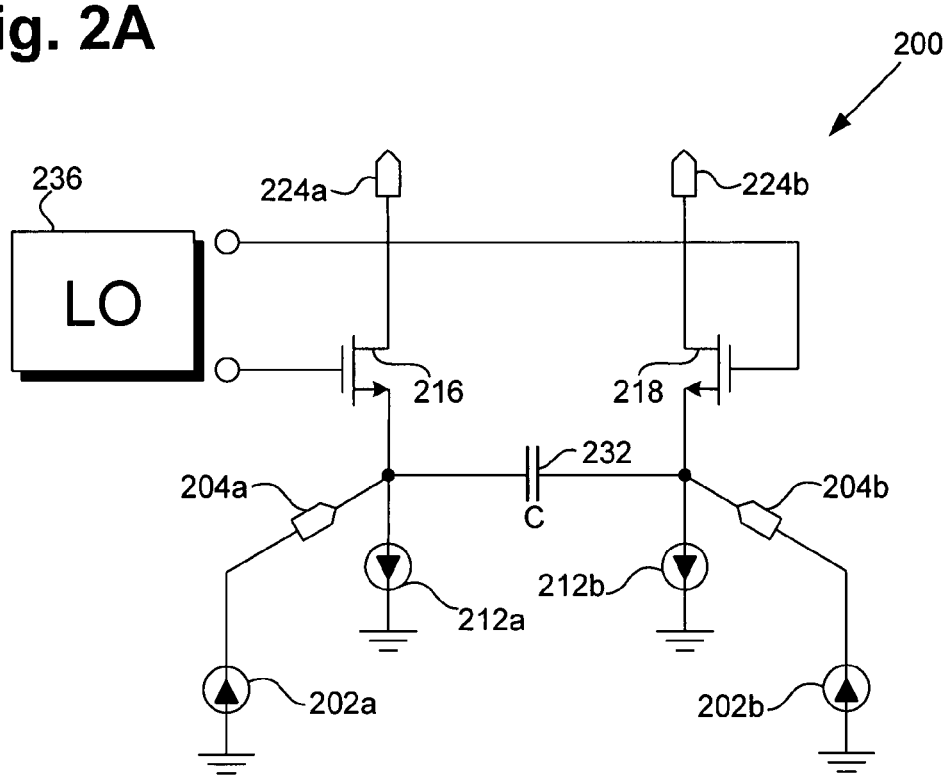
FIG. 2A illustrates a mixer circuit according to one embodiment of the present invention.

FIG. 2A illustrates novel mixer circuit 200 according to one embodiment of the present invention, which overcomes the disadvantages associated with the conventional implementation as described above. The inventive mixer circuit 200 in FIG. 2A includes input RF current sources 202a and 202b, mixer circuit inputs 204a and 204b, bias current sources 212a and 212b providing bias currents to mixer transistors 216 and 218, and mixer circuit outputs 224a and 224b. As shown in FIG. 2A, capacitor 232 couples respective sources of mixer transistors 216 and 218. Further shown in FIG. 2A is local oscillator 236 providing input to respective gates of mixer transistors 216 and 218. Absent in FIG. 2A is separate high pass filter 132 of FIG. 1A that was required for blocking cancellation of the undesired signal component in the conventional implementation shown in FIG. 1A. By way of non-exhaustive examples, the present invention's mixer circuit 200 shown in FIG. 2A can be utilized for down conversion and filtering of an input RF signal in various devices, such as a wireless telephone receiver, a lap top computer, a PDA (personal digital assistant), an MP3 player, a satellite set top box, or a Bluetooth enabled device, for example.

In the embodiment of the present invention shown in FIG. 2A, input RF signals provided by input RF current sources 202a and 202b are received at mixer circuit inputs 204a and 204b. Mixer transistors 216 and 218, shown as FETs 216 and 218 in the present embodiment are part of what is referred to as first and second switching branches in the present application, and are driven by local oscillator 236 and input RF signals from RF sources 202a and 202b to produce down-converted signals at outputs 224a and 224b. While in the present embodiment, mixer FETs 216 and 218 are utilized as part of the first and second switching branches, in other embodiments, FETs 216 and 218 may be replaced by other switching components, for example, bipolar transistors.

Capacitor 232 is coupled between the first and second switching branches and provides, in essence, high pass filtering of the down-converted signal produced in the present embodiment's mixer circuit 200. As a result of the presence of capacitor 232, the down-converted signal provided at outputs 224a and 224b may be directly amplified without concerns regarding saturation of the subsequent amplifier by the presence of an undesired signal component, or amplification of filter noise introduced by a separate high pass filter. Thus, due to inclusion of capacitor 232 in the present embodiment, the signal provided at outputs 224a and 224b at a point structurally analogous to mixer circuit outputs 124a and 124b in the conventional implementation shown in FIG. 1A, is, from a signal processing standpoint, analogous to output 134 of high pass filter 132 in that figure. While analogous to a signal at output 134 in the conventional implementation of FIG. 1A, the signal provided at outputs 224a and 224b in the present embodiment has the additional advantage of being free of filter noise introduced by high pass filter 132 in FIG. 1A.

The effect of incorporating capacitor 232 in the embodiment shown in mixer circuit 200 of FIG. 2A can be explained in terms of the circuit's resulting transfer function after down-conversion, which is presented here as Equation 1:

$$H(j\omega) = jC\omega/(jC\omega + 4I_{dc}/\pi A) \quad \text{(Equation 1);}$$

where C is the capacitance of capacitor 232 in FIG. 2A, $I_{dc}$ is the value of bias currents provided by bias current sources 212a and 212b, and A is the amplitude of the signal provided by local oscillator 236.

Figure 2B:
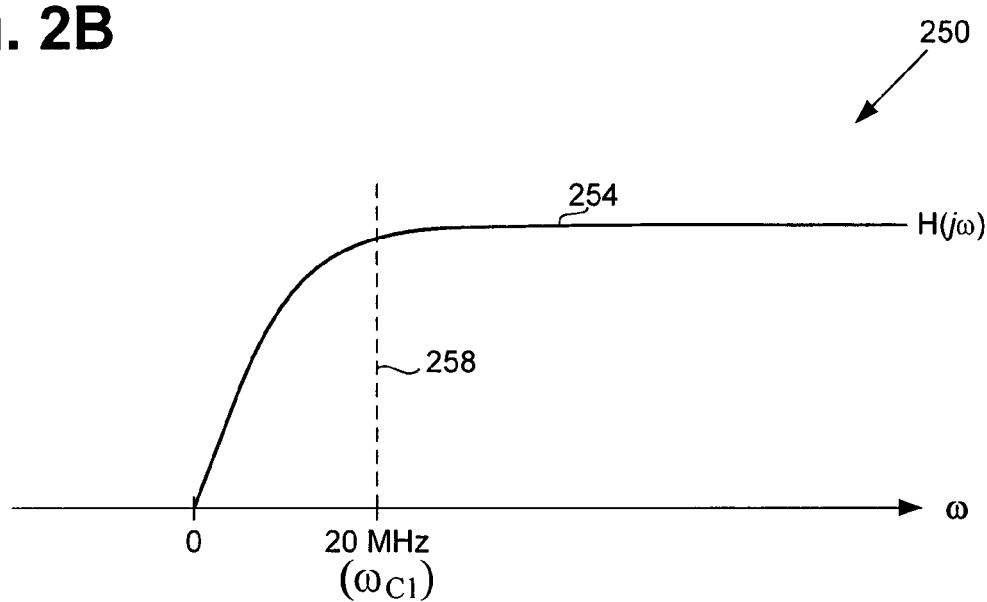
FIG. 2B is a graph showing an exemplary high pass transfer function for the mixer circuit of FIG. 2A after down-conversion.

FIG. 2B is a graph showing an exemplary transfer function after down-conversion for mixer circuit 200 of FIG. 2A, as defined by Equation 1. As shown by Equation 1 and graph 250 of FIG. 2B, capacitor 232 in the invention's mixer circuit 200 causes, in effect, the high pass filtering of the signal provided at outputs 224a and 224b. Graph 250 in FIG. 2B shows exemplary transfer function 254 having 3-dB corner frequency ($\omega_{c1}$) 258, where $\omega_{c1}$ 258 is given by Equation 2:

$$\omega_{c1} = 4I_{dc}/\pi AC \quad \text{(Equation 2);}$$

the variables $I_{dc}$, A, and C having the same values as described with reference to Equation 1. For example, an $I_{dc}$ of 50 uA, local oscillator signal amplitude A of 300 mV, and a Capacitance C of 1.7 pF, results in $\omega_{c1}$ 258 having a value of approximately 20 MHz. Thus, a down-converted signal produced in the invention's mixer circuit 200 under the conditions described undergoes high pass filtering corresponding to graph 250 of FIG. 2B prior to appearing at outputs 224a and 224b. As a result, a separate high pass filter is not needed and, consequently, the invention's mixer circuit 200 provides, among other advantages, a down-converted and high pass filtered output that is free of the additional filter noise introduced in conventional implementations.

In the case of the exemplary input RF signal shown in FIG. 1B, for example, down-conversion of the received input RF signal by mixer circuit 200 by utilizing local oscillator frequency, $f_{LO}$, tuned to match a strong undesired signal component at 2.0 GHz, results in an undesired signal component near DC and a desired signal component at 80 MHz. As shown by FIG. 2B, the presence of capacitor 232 in the present embodiment of the invention's mixer circuit results in blocking cancellation of low frequency components, including the undesired signal component at DC. As is also shown by FIG. 2B, frequencies above approximately 20 MHz are freely passed, so that the desired signal at 80 MHz emerges from the circuit at outputs 224a and 224b in FIG. 2A.

Thus, the embodiment of the invention's mixer circuit shown in FIG. 2A results in, among other advantages, a mixer circuit that accomplishes with a single circuit, what conventional implementations require more than one circuit to achieve. As a result, the present embodiment provides a single compact circuit capable of down-conversion and high pass filtering of an input RF signal, free of the disadvantages described in association with conventional implementations, including higher cost, greater consumption of space, and signal degradation due to added filter noise.

Figure 3A:
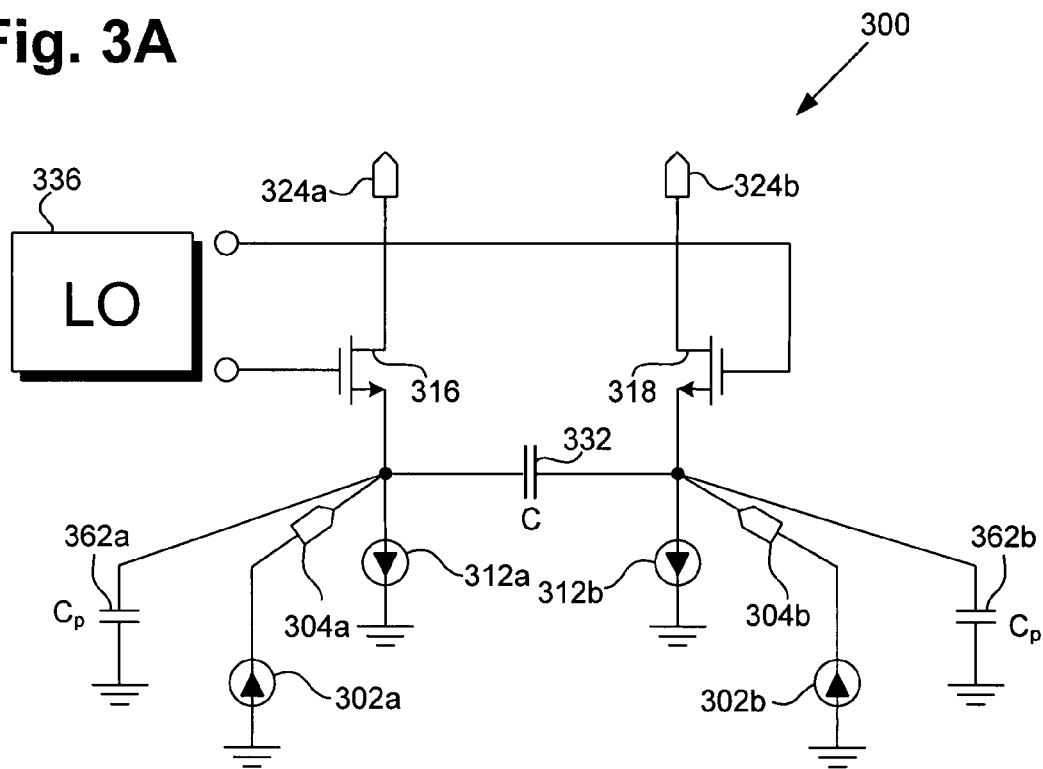
FIG. 3A shows the presence of parasitic capacitors in the circuit of FIG. 2A.

FIG. 3A shows the presence of parasitic capacitors in the circuit of FIG. 2A. Mixer circuit 300 in FIG. 3A includes input RF sources 302a and 302b, mixer circuit inputs 304a and 304b, and bias current sources 312a and 312b providing bias currents to, respectively, mixer transistors 316 and 318. Mixer circuit 300 further includes capacitor 332, and mixer circuit outputs 324a and 324b. The recited elements correspond, respectively, to input RF sources 202a and 202b, mixer circuit inputs 204a and 204b, bias current sources 212a and 212b, mixer transistors 216 and 218, capacitor 232, and mixer circuit outputs 224a and 224b, in FIG. 2A. Moreover, local oscillator 336 in FIG. 3A corresponds to local oscillator 236 in FIG. 2A. In addition FIG. 3A shows parasitic capacitors 362a and 362b, present but not shown in FIG. 2A.

Parasitic capacitors 362a and 362b in FIG. 3A represent parasitic capacitances of the mixer circuit due to, for example, capacitances arising from circuit elements (not shown) associated with bias current sources (i.e. bias current sources 312a and 312b or bias current sources 212a and 212b), and junction capacitances of mixer circuit transistors (i.e. mixer transistors 316 and 318 or mixer transistors 216 and 218), and other parasitic capacitances, such as diffusion, interconnect parallel plate and/or fringe capacitances that ordinarily exist in integrated circuits and cause capacitive loading of various nodes in electrical circuits. The effect on the circuit of FIG. 3A of the presence of parasitic capacitors 362a and 362b is creation of a shunt to ground for high frequency input signals received at mixer circuit inputs 304a and 304b. In other words, parasitic capacitors 362a and 362b represent a de facto low pass filter at the inputs of mixer circuit 300.

Figure 3B:
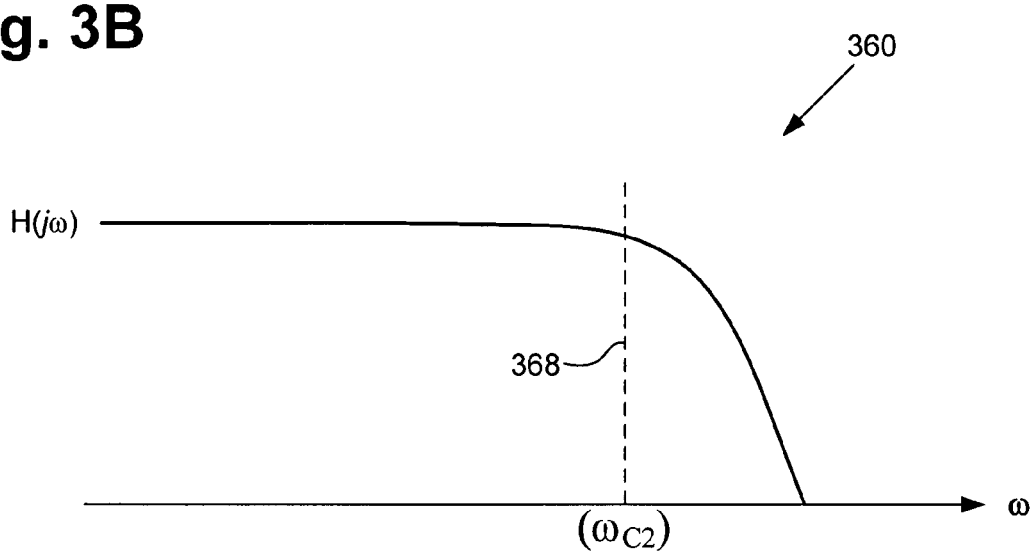
FIG. 3B is a graph showing an exemplary transfer function at an input of the circuit in FIG. 3A for the RF signal before down-conversion.

FIG. 3B is a graph showing an exemplary transfer function for RF signal before down-conversion at inputs 304a and 304b of mixer circuit 300 in FIG. 3A, as a result of the presence of parasitic capacitors 362a and 362b. As can be seen from graph 360, input signals having frequency less than $\omega_{c2}$ 368 pass through mixer circuit 300 inputs 304a and 304b and into the circuit, while input signals having frequency greater than $\omega_{c2}$ are blocked, in this instance by being shunted to ground. The effect of parasitic capacitors 362a and 362b on the performance of the present invention's mixer circuit may be negligible where $\omega_{c2}$ 368 is greater, i.e. is a higher frequency, than an input signal of interest. As the frequency of a desired input signal becomes greater, however, the signal of interest may be undesirably shunted away from the circuit unless a solution for mitigating the presence of parasitic capacitors 362a and 362b is provided.

Figure 4A:
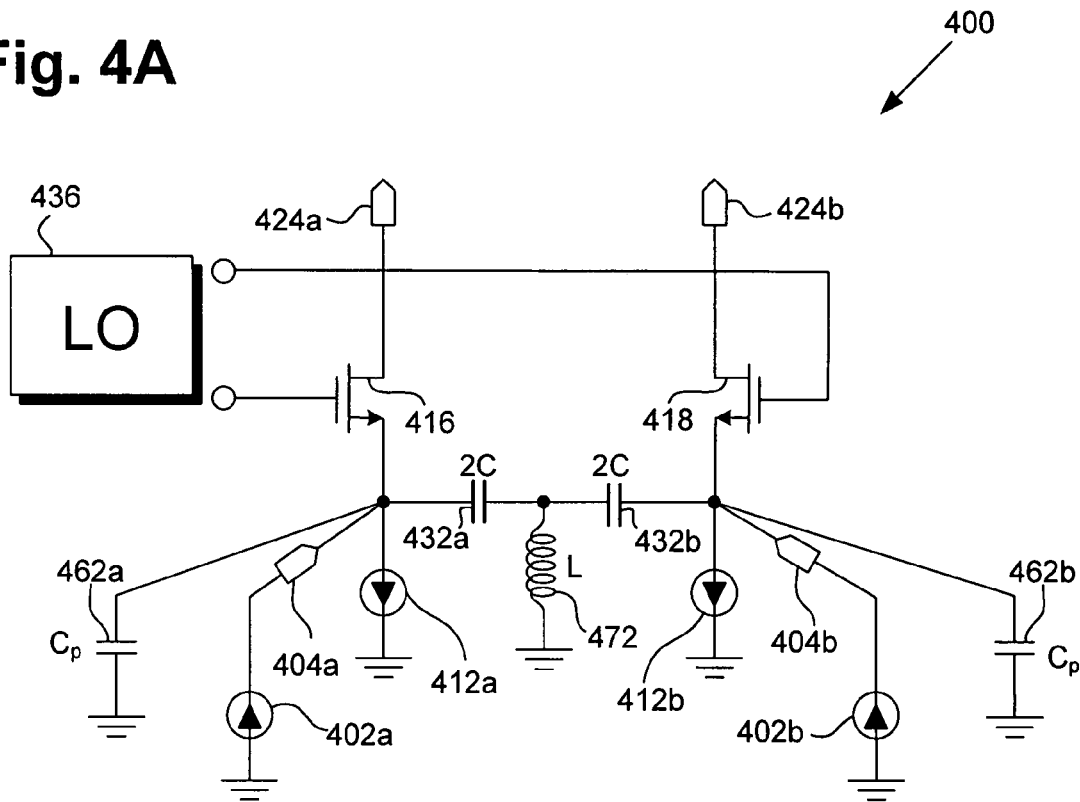
FIG. 4A illustrates a mixer circuit according to another embodiment of the present invention.

FIG. 4A illustrates a mixer circuit, according to one embodiment of the present invention, to reduce or eliminate the undesirable effect of parasitic capacitors discussed previously. Mixer circuit 400 in FIG. 4A includes input RF sources 402a and 402b, mixer circuit inputs 404a and 404b, and bias current sources 412a and 412b providing bias currents to, respectively, mixer transistors 416 and 418. Mixer circuit 400 further includes capacitors 432a and 432b, and mixer circuit outputs 424a and 424b. The recited elements correspond, respectively, to input RF sources 302a and 302b, mixer circuit inputs 304a and 304b, bias current sources 312a and 312b, mixer transistors 316 and 318, capacitor 332, and mixer circuit outputs 324a and 324b, in FIG. 3A. Moreover, local oscillator 436 in FIG. 4A corresponds to local oscillator 336 in FIG. 3A. In addition, FIG. 4A shows parasitic capacitors 462a and 462b, which correspond to parasitic capacitors 362a and 362b in FIG. 3A. Also shown in FIG. 4A is inductor 472, having no analogue in previous figures.

In the embodiment of FIG. 4A, capacitors 432a and 432b share a common terminal, with each capacitor having, for example, approximately twice the capacitance of capacitor 332 in FIG. 3A. The equivalent capacitance of capacitors 432a and 432b is thus approximately equal to the capacitance provided by capacitor 332 in FIG. 3A. Inductor 472 is connected to the common terminal of capacitors 432a and 432b, coupling the common terminal to ground. Arranged as shown in mixer circuit 400, inductor 472 may be selected to be in resonance with parasitic capacitors 462a and 462b, producing a high impedance to ground around the resonance frequency. Where inductor 472 is selected to be in resonance with parasitic capacitors 462a and 462b at the frequency of local oscillator 436, itself tuned to down-convert an incoming input RF signal, mixer circuit 400 can be utilized to produce a band pass filter tuned to receive signals at frequencies of interest at its inputs.

Figure 4B:
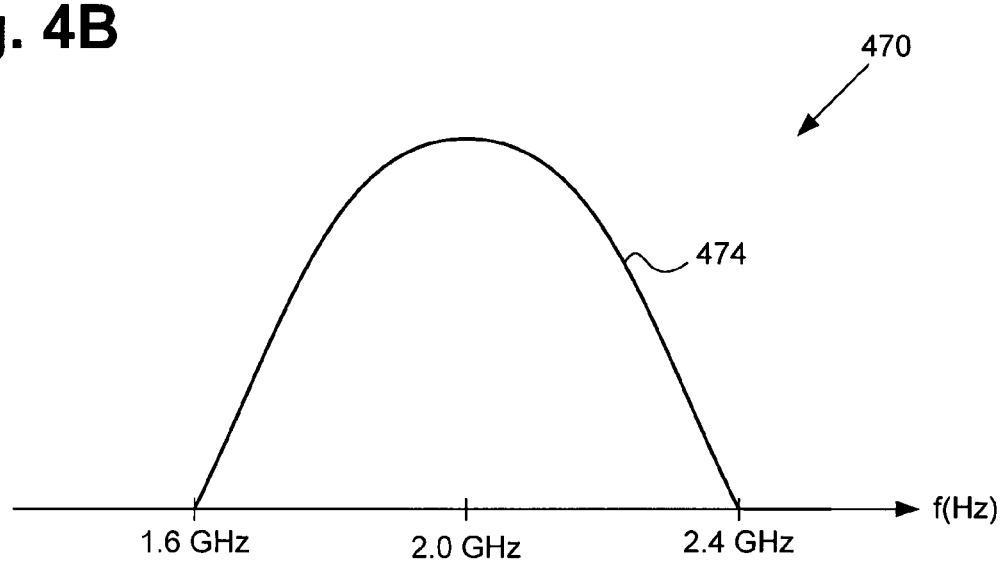
FIG. 4B is a graph showing the band pass filtering for the RF signal before down-conversion provided by the embodiment of the invention shown in FIG. 4A.

FIG. 4B shows graph 470 illustrating the band pass effect of including inductor 472 in mixer circuit 400 and selecting the value of its inductance to be in resonance with parasitic capacitors 462a and 462b at an exemplary desired RF signal frequency of approximately 2.08 GHz. Revisiting exemplary input RF signal 105 of FIG. 1B comprising a large undesired signal component at 2.0 GHz and a smaller desired signal component of 2.08 GHz, FIG. 4B shows that suitable selection of inductor 472 can provide a filtering effect having a band pass width of, for example, approximately 800 MHz, corresponding to, for example, an input RF signal frequency range of between approximately 1.6 GHz and 2.4 GHz, as shown by frequency distribution 474. In other words, inductor 472 may be selected so as to counteract the shunting effect of parasitic capacitors 462a and 462b, while providing passage with ample bandwidth for signals of interest by the present invention's mixer circuit.

The various embodiments of the present invention's mixer circuit can be utilized in an electronic system in, for example, a wired communications device, a wireless communications device, a cell phone, a Bluetooth enabled device, a computer, a monitor, a television set, a satellite set top box, a cable modem, an audio or video receiver, a personal digital assistant (PDA), or in any other kind of system, device, component or module utilized as a receiver in modern electronics applications.

Thus, the various embodiments of the present invention advantageously provide blocking cancellation of a strong undesired signal component while adding substantially no filter noise. As a result, the present invention offers a higher performance, smaller, and more cost effective solution, capable of producing an output signal of higher quality than is available from conventional implementations.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a merged high pass filtering and down-converting mixer circuit has been described.

The invention claimed is:

1. A mixer circuit comprising:
   first and second switching branches driven by a local oscillator and an input RF signal;
   said first and second switching branches providing a down-converted output signal;
   at least two capacitors coupled between said first and second switching branches for high-pass filtering said down-converted output signal of said mixer circuit, said at least two capacitors sharing a common terminal;
   at least one inductor coupling said common terminal of said two capacitors to ground.

2. The mixer circuit of claim 1 wherein each of said first and second switching branches comprises at least one transistor.

3. The mixer circuit of claim 2 wherein said at least one transistor is a FET.

4. The mixer circuit of claim 3 wherein a gate of said FET is driven by said local oscillator and a source of said FET is driven by said input RF signal.

5. The mixer circuit of claim 3 wherein a drain of said FET provides said down-converted output signal.

6. The mixer circuit of claim 1 wherein said at least one inductor has an inductance selected to be in resonance with parasitic capacitors of said mixer circuit at a resonance frequency substantially equal to a frequency of said local oscillator.

7. The mixer circuit of claim 6 wherein said inductor interacts with said parasitic capacitors to provide band pass filtering of said input RF signal in a bandwidth of approximately 800 MHz.

8. The mixer circuit of claim 1 wherein said local oscillator drives said first and second switching branches at a frequency less than a desired frequency of said input RF signal.

9. The mixer circuit of claim erein said input RF signal has a frequency in a range from approximately 1.9 GHz to approximately 2.1 GHz.

10. The mixer circuit of claim 1 wherein said input RF signal has a frequency in a range from approximately 1.6 GHz to approximately 2.4 GHz.

11. The mixer circuit of claim 1 utilized as a part of an electronic system, said electronic system being selected from the group consisting of a wired communications device, a wireless communications device, a cell phone, a Bluetooth enabled device, a computer, a monitor, a television set, a satellite set top box, a cable modem, an audio or video receiver, and a personal digital assistant (PDA).

12. A mixer circuit comprising:
   first and second switching branches driven by a local oscillator and an input RF signal;
   said first and second switching branches providing a down-converted output signal;
   first and second high pass filtering blocks coupled between said first and second switching branches for high-pass filtering said down-converted output signal of said mixer circuit, said at least first and second high pass filtering blocks sharing a common terminal;
   a third high pass filtering block coupling said common terminal to ground.

13. The mixer circuit of claim 12 wherein at least one of said first and second high pass filtering blocks comprises a capacitor.

14. The mixer circuit of claim 12 wherein said third high pass filtering block comprises an inductor.

15. The mixer circuit of claim 12 wherein each of said first and second switching branches comprises at least one FET, wherein a gate of said FET is driven by said local oscillator and a source of said FET is driven by said input RF signal.

16. The mixer circuit of claim 15 wherein a drain of said FET provides said down-converted output signal.

* * * * *